United States Patent
Chen et al.

(10) Patent No.: US 10,045,466 B1
(45) Date of Patent: Aug. 7, 2018

(54) HIGH PERFORMANCE SERVER THROUGH IMPROVED HYBRID COOLING

(71) Applicant: QUANTA COMPUTER INC., Taoyuan (TW)

(72) Inventors: Chao-Jung Chen, Taoyuan (TW); Chih-Ming Chen, Taoyuan (TW); Yi-Chieh Chen, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 0 days.

(21) Appl. No.: 15/581,491

(22) Filed: Apr. 28, 2017

(51) Int. Cl.
| | |
|---|---|
| *H05K 7/20* | (2006.01) |
| *G06F 1/20* | (2006.01) |
| *H05K 1/02* | (2006.01) |
| *H01L 23/473* | (2006.01) |

(52) U.S. Cl.
CPC ........... *H05K 7/20772* (2013.01); *G06F 1/20* (2013.01); *G06F 1/206* (2013.01); *H05K 1/0203* (2013.01); *H05K 7/209* (2013.01); *H05K 7/2039* (2013.01); *H05K 7/20136* (2013.01); *H05K 7/20145* (2013.01); *H05K 7/20172* (2013.01); *H05K 7/20254* (2013.01); *H05K 7/20272* (2013.01); *H05K 7/20727* (2013.01); *H05K 7/20736* (2013.01); *H05K 7/20745* (2013.01); *H05K 7/20836* (2013.01); *G06F 2200/201* (2013.01); *H01L 23/473* (2013.01); *H05K 2201/066* (2013.01)

(58) Field of Classification Search
None
See application file for complete search history.

(56) References Cited

U.S. PATENT DOCUMENTS

| | | | | |
|---|---|---|---|---|
| 2004/0008483 | A1* | 1/2004 | Cheon | G06F 1/20 361/679.53 |
| 2005/0068728 | A1* | 3/2005 | Chu | G06F 1/20 361/690 |
| 2012/0180993 | A1* | 7/2012 | Yoshikawa | H01L 23/427 165/104.21 |
| 2013/0271918 | A1 | 10/2013 | Hughes et al. | |
| 2015/0160702 | A1 | 6/2015 | Franz | |
| 2016/0353613 | A1 | 12/2016 | Chen et al. | |

FOREIGN PATENT DOCUMENTS

| | | |
|---|---|---|
| TW | M271199 U | 7/2005 |
| TW | 201642727 A | 12/2016 |

OTHER PUBLICATIONS

TW Office Action for Application No. 106121490, dated Dec. 12, 2017, w/ First Office Action Summary.
TW Search Report for Application No. 106121490, (report conducted Dec. 3, 2017) dated Dec. 12, 2017.
Extended European Search Report for EP Application No. 17195881.2, dated May 4, 2018.

* cited by examiner

*Primary Examiner* — Dimary Lopez Cruz
*Assistant Examiner* — Zhengfu Feng
(74) *Attorney, Agent, or Firm* — Nixon Peabody LLP; Eduardo J. Quiñones; Zhou Lu

(57) ABSTRACT

The present invention provides a hybrid cooled blade server enclosure having a liquid-cooled insert having a chilled surface for contacting a heat exchange block on the blade server and an electric fan for removing heated air from the enclosure.

20 Claims, 3 Drawing Sheets

HIGH PERFORMANCE SERVER THROUGH IMPROVED HYBRID COOLING

FIELD OF THE INVENTION

The present invention provides a hybrid cooled enclosure for a blade server having a high performance processor onboard.

BACKGROUND

Enclosures for blade servers commonly accommodate a plurality of vertically spaced blade servers. The enclosures typically have a fan or a plurality of fans to remove heated air generated by a processor or processors onboard the blade. As processor speed increases, the required current to drive the processor increases as does the heat generated by the processor. Fans in some cases are inadequate and the temperature of the enclosure reaches a temperature where the processor can become damaged or be forced to operate at lower processing speeds to avoid damage. Thus, the need has arisen for additional cooling in blade server enclosures. The present invention provides an insert for mounting to a blade server enclosure to provide a liquid chilled surface, and preferably, a chilled surface dedicated to each blade server in the enclosure.

SUMMARY

The present invention provides a liquid-cooled insert for a blade server enclosure. The enclosure has a slot for receiving a blade server, the blade server having a processor that generates heat and a heat transfer block for dissipating heat from the processor. When the blade server is positioned in the enclosure the heat transfer block is located within a heat transfer zone of the enclosure. The insert includes a manifold mounted to the enclosure for supporting a chilled surface extending in a plane parallel to the slots and extending into the heat transfer zone. The chilled surface has a fluid conduit running there through with a cold liquid inlet and a hot liquid outlet. The chilled surface is in the heat transfer zone to engage the heat transfer block to dissipate heat from the processor when a blade server is within a slot of the enclosure. A first conduit connects a supply of cold liquid with the cold liquid inlet, and a second conduit connects the hot liquid outlet away from the heat transfer zone.

The enclosure can have a first plurality of slots spaced from one another along a first direction and the manifold can have a second plurality of chilled surfaces spaced along the first direction wherein the second plurality is equal to or greater than the first plurality. The first conduit and the second conduit extend along the first direction, and the second plurality of chilled surfaces extends along a second direction generally perpendicular to the first direction. The chilled surface has a generally circular shape in cross-sectional dimension and the heat transfer block has a concave channel for contacting the chilled surface. The manifold has a peripheral wall defining a channel and the chilled surface is positioned within the channel.

The present invention further provides a blade server enclosure having a slot in the enclosure for receiving a blade server having a processor that generates heat, and a heat transfer block for dissipating heat from the processor in a heat transfer zone of the enclosure. A manifold is mounted to the enclosure for supporting a chilled surface extending in a plane parallel to the slot and extending into the heat transfer zone. The chilled surface has a fluid conduit running there through and having a cold liquid inlet and a hot liquid outlet, the chilled surface is in the heat transfer zone to engage a heat transfer block. The enclosure further has a first conduit connecting a supply of cold liquid with the cold liquid inlet; and a second conduit connecting the hot liquid outlet away from the heat transfer zone.

The blade server enclosure further includes an electric fan mounted to the enclosure for dissipating heat from the enclosure. The manifold is positioned inward of the enclosure with respect to the fan. The enclosure has a first plurality of slots spaced from one another along a first direction, and the manifold has a second plurality of chilled surfaces spaced along the first direction wherein the second plurality is equal to or greater than the first plurality. The first conduit and the second conduit extend along the first direction, and the second plurality of chilled surfaces extends along a second direction generally perpendicular to the first direction. The chilled surface has a generally circular shape in cross sectional dimension and the heat transfer block has a concave channel for contacting the chilled surface. The manifold has a peripheral wall defining a channel and the chilled surface is positioned within the channel.

The present invention further provides a hybrid cooled blade server enclosure having a slot in the enclosure for receiving a blade server having a processor that generates heat, and a heat transfer block for dissipating heat from the processor in a heat transfer zone of the enclosure. A manifold is mounted to the enclosure for supporting a chilled surface extending in a plane parallel to the slot and extending into the heat transfer zone. The chilled surface has a fluid conduit running there through having a cold liquid inlet and a hot liquid outlet. The chilled surface is in the heat transfer zone to engage a heat transfer block. A first conduit connects a supply of cold liquid with the cold liquid inlet, and a second conduit connects the hot liquid outlet to a position outside the heat transfer zone. The enclosure also has an electric fan mounted to the enclosure for removing heat from the enclosure. The electric fan is positioned outward of the enclosure from the manifold.

The hybrid cooled blade server enclosure further includes a first plurality of slots spaced from another along a first direction in the enclosure and the manifold having a second plurality of chilled surfaces spaced along the first distance wherein the second plurality is equal to or greater than the first plurality. The first conduit and the second conduit extend along the first direction, and the second plurality of chilled surfaces extend along a second direction generally perpendicular to the first direction. The chilled surface has a generally circular shape in cross sectional dimension and the heat transfer block has a concave channel for contacting the chilled surface. The manifold has a peripheral wall defining a channel and the chilled surface is positioned within the channel and the peripheral wall is generally C-shaped. The cold liquid inlet extends through a hole in the peripheral wall.

BRIEF DESCRIPTION OF THE DRAWINGS

To understand the present invention, it will now be described by way of example, with reference to the accompanying drawings and attachments in which.

DETAILED DESCRIPTION

Figure 1:
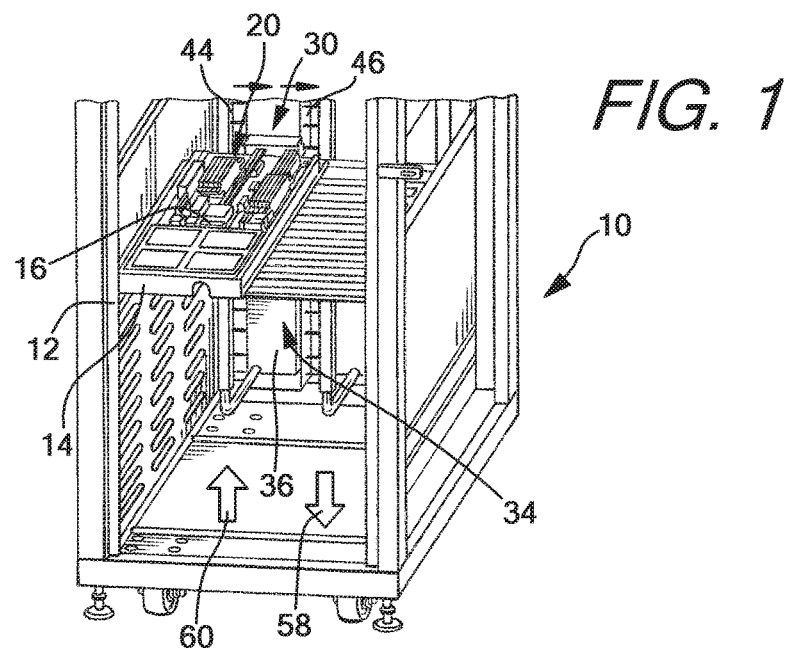
FIG. 1 is a perspective view of a water-cooled blade server enclosure.

While this invention is susceptible of embodiments in many different forms, there is shown in the drawings and will herein be described in detail preferred embodiments of the invention with the understanding that the present disclosure is to be considered as an exemplification of the principles of the invention and is not intended to limit the broad aspect of the invention to the embodiments illustrated.

Figure 2:
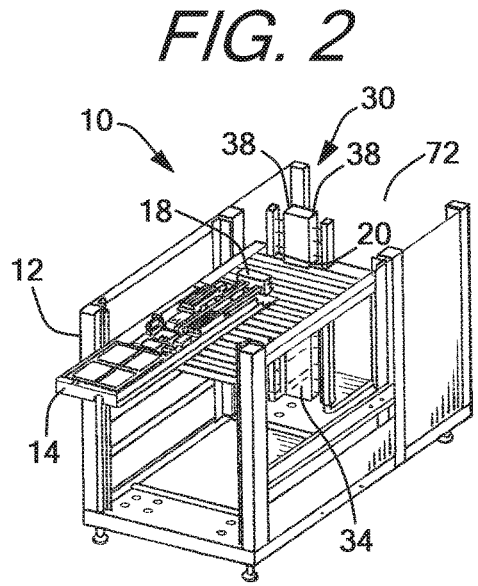
FIG. 2 is a perspective view of a water-cooled blade server enclosure during insertion of a blade server into the enclosure.
Figure 3:
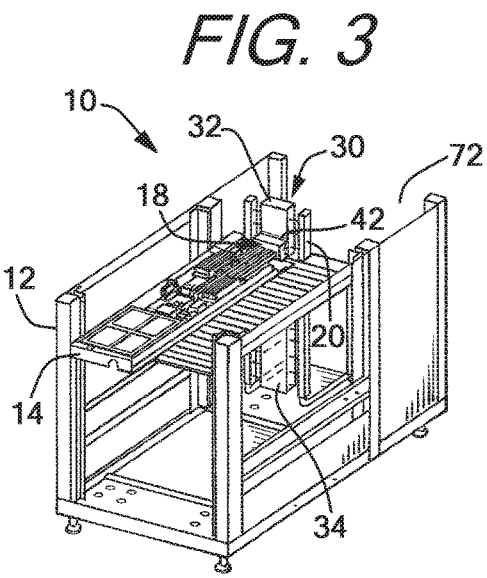
FIG. 3 is a perspective view of a water-cooled blade server enclosure with the blade server fully inserted into the enclosure with a heat exchange block of the blade server in contact with a chilled surface of an insert.

FIGS. 1-3 show a hybrid cooled blade server enclosure 10 having a slot 12, or other type of support, in the enclosure for receiving and supporting a blade server 14. A single blade server 14 is shown for discussion purposes, but the enclosure can accommodate a plurality of blade servers supported by a plurality of slots 12 spaced from one another along a first direction and with each blade server extending in parallel planes. The plurality of slots 12 are shown oriented in vertical-spaced relationship as an example. However, it should be understood the plurality of slots 12 could also be oriented in horizontal-spaced relationship or even along other parallel planes.

FIGS. 4 through 7 show the blade server 14 has a processor 16 that generates heat, and a heat transfer block 18 for dissipating heat from the processor 16. While a single heat exchange block 18 is shown, it is contemplated that numerous heat exchange blocks 18, say two to ten, for example, could be provided on each blade server without departing from the scope of the present invention. The heat exchange block should be fabricated from a material that dissipates heat such as a metal, including copper, aluminum, brass, iron, steel, etc. A surface 19 (FIG. 5) of the heat exchange block 18 is adapted to contact a liquid-cooled surface described below. The surface can have a shape complementary to the shape of the cooled surface to maximize the area of engagement of these heat exchange surfaces to maximize the heat exchange capacity. Suitable shapes include those that are complementary to a portion of a circle, an ellipse, or a polygon. Suitable polygonal shapes include polygons having from 3 to 12 vertices and include, triangles, rectangles, squares, pentagons, etc. Additionally, the heat exchange block can be configured to engage multiple chilled surfaces.

The heat exchange block 18 can be mounted to the blade server directly or through rigid connections. It is also contemplated, the heat exchange block 18 can be mounted for pivotal movement about an axis and biased by a spring force so that the heat exchange block 18 is continuously pressed against the chilled surface 42. The surface of the heat exchange block can also be textured to form an irregular surface or a matte finish.

The enclosure is said to be "hybrid cooled" as it provides a liquid chilled surface 42 in a position to contact the heat exchange (or transfer) block 18 of the blade server 14, in combination with, a flow of chilled air circulated by an electric fan. The heat transfer block 18 is dimensioned to contact the chilled surface 42 when the blade server is fully inserted into the enclosure. In this position, the heat transfer block 18 is in surface contact with the chilled surface 42 in a heat transfer zone 20 of the blade server. The heat transfer zone 20 encompasses a volume of space encompassing the processor 16, and moving rearward, to and including a fan area 72 of the enclosure, and any electrical components, heat fins or other features on the blade server. Such hybrid cooling provides a suitable environment for high speed and high heat generating processors used in some of today's blade servers.

In one form of the invention, the chilled surface 42 is generally flat and rectangular, having top end and a bottom end and opposed lateral edges. The surface can be a continuous web of material having the chilled surface 42 on one side of the web, and an opposed surface on a second side of the web for directly or indirectly contacting a flow of chilled liquid from a source of chilled liquid. In one form of the invention, the chilled surface is on one face of a rectangular tube with chilled liquid flowing along its length through a lumen in the tube. A single chilled surface 42 can provide cooling to each and every blade server that can be accommodated in the enclosure or to a subset of the blades.

The chilled surface 42 may also include a plurality of surfaces 42, one or more of each, corresponding to a possible location in the enclosure of a heat exchange block. An enclosure that can accommodate, say five blade servers, will have 5 chilled surfaces. There may be more than one chilled surface per blade including multiples thereof such as two to five chilled surfaces per blade. It is also contemplated that a single chilled surface can contact more than one heat exchange block.

As best seen in FIGS. 1-3 and 7, a plurality of vertically spaced chilled surfaces 42 are provided in a manifold 30. One of each of the plurality of chilled surfaces 42 is positioned to engage a heat exchange block 18 of a blade server 14. The manifold 30 has a generally C-shaped wall 32 defining a vertical channel 34. The C-shaped wall has a generally rectangular backbone 36 with terminal flanges 38 extending perpendicularly away from the backbone 36 in the same direction. The terminal flanges 38 each have a plurality of vertically spaced through holes 40, one of each through hole 40 on one terminal flange 38 being in registration with one of each through hole 40 in the opposed terminal flange 38. A plurality of chilled fluid conduits 42 extends through the channel 34 from one terminal flange 38 to the opposed terminal flange 38 and at least one of each are for engaging the heat exchange block 18. Each of the plurality of fluid conduits 42 receives at one end 44 a supply of chilled liquid, and drains heated liquid from an opposed end 46 to remove heat from the heat exchange block 18.

A chilled liquid supply conduit 48 extends vertically along one terminal flange 38 and has a lumen 49 for supplying chilled liquid under pressure to a plurality of branch supply conduits 50. (FIGS. 5 and 6) The branch supply conduits 50 are vertically spaced from one another, and extend generally perpendicular from the chilled liquid supply conduit 48. One of each of the branch supply conduits 50 is in fluid communication with the end 44 of one of each of the fluid conduits 42.

Figure 5:
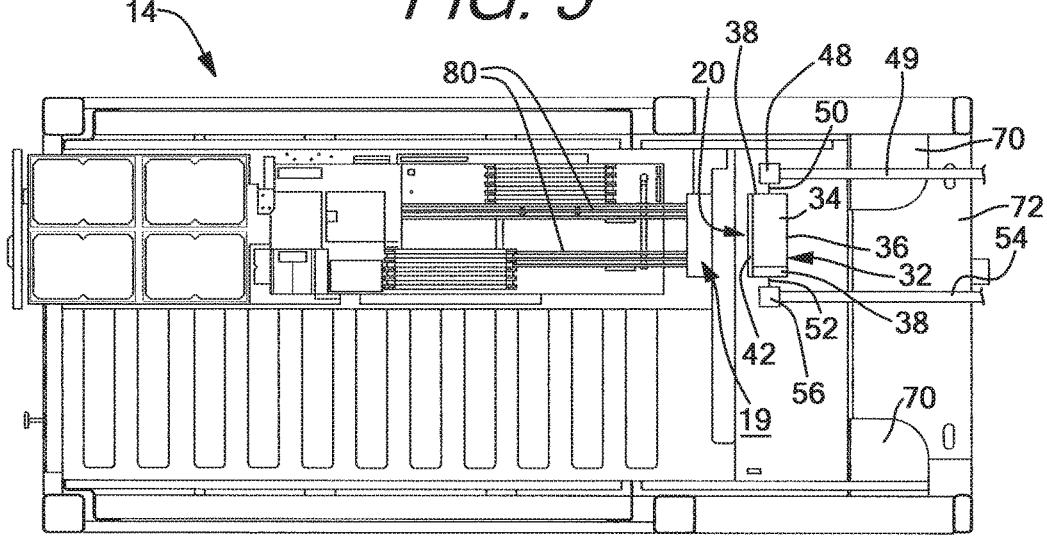
FIG. 5 is a top plan view of a blade server with its heat exchange block separated from the chilled surface of the insert.
Figure 6:
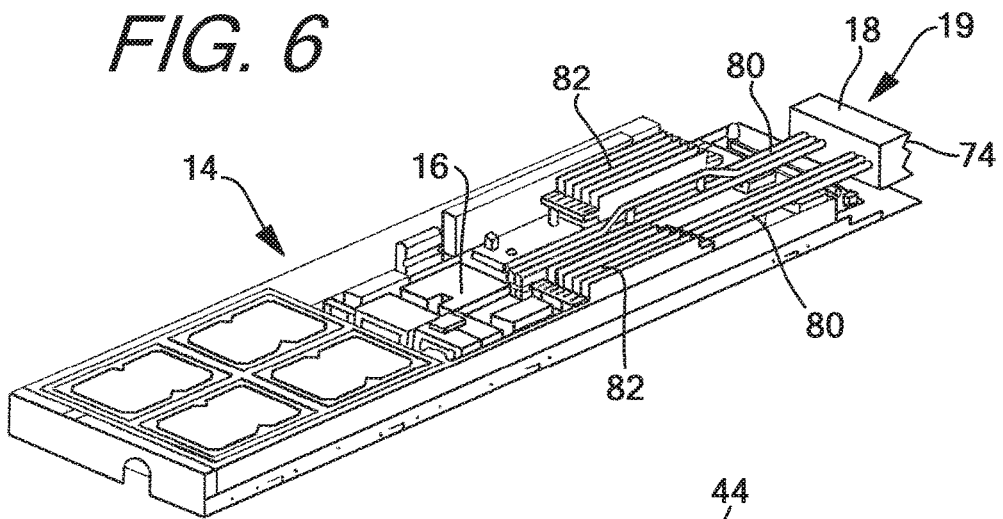
FIG. 6 is a perspective view of a blade server.

FIGS. 5 and 6 show a heated liquid drain conduit 52 extending vertically along the opposed terminal flange 38 and having a lumen 54 for draining heated liquid under pressure from a plurality of branch drain conduits 56. The branch drain conduits 56 are vertically spaced from one another, and extend perpendicular from the heated liquid drain conduit 54. One of each of the branch drain conduits 56 are in fluid communication with the end 46 of one of each of the fluid conduits 42. The flow of heated liquid is shown in FIG. 1 to be in a downward 58 direction while the flow of chilled liquid is shown flowing upward 60. This arrangement is merely an example and the direction of the flows of liquids can be different so long as the fluid flow serves to provide a chilled surface or chilled surfaces.

Figure 4:
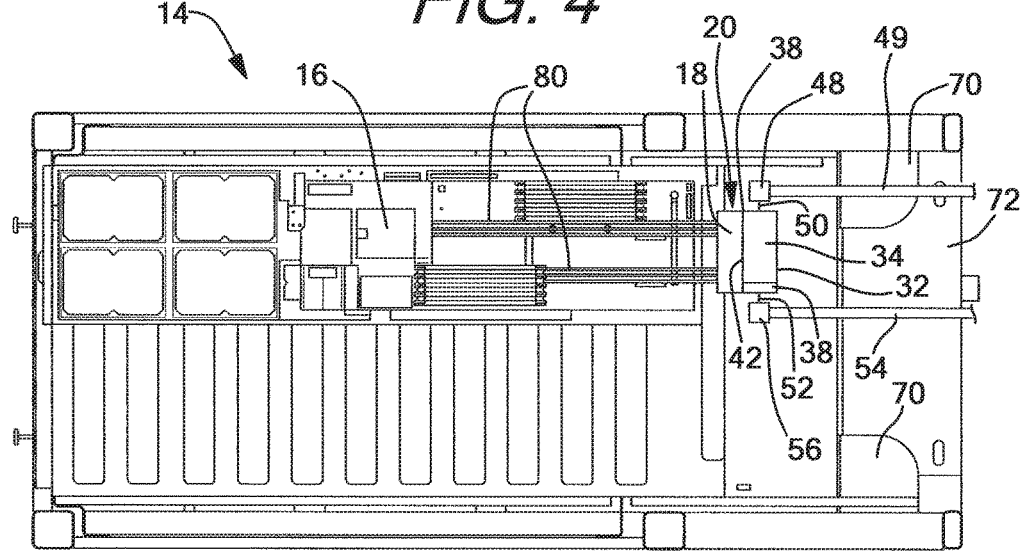
FIG. 4 is a top plan view of a blade server with its heat exchange block in contact with the chilled surface of the insert.

The plurality of chilled fluid conduits 42 are positioned in the heat transfer zone 20. One of each of the plurality of chilled fluid conduits 42 engages a heat transfer block 18 of one of each of a plurality of blade servers 14 to provide liquid cooling to the enclosure 10. The enclosure 10 also has an electric fan 70, or two fans as shown in FIGS. 4 and 5 mounted to the enclosure 10 for removing heat from the enclosure 10. FIGS. 1-3 show a fan area 72 with the fans 70 removed. The fan area 72 has fluid access through vents or an open wall to ambient conditions of a server room so that chilled air can be circulated in the heat exchange zone 20. The electric fan 70 is positioned outward of the enclosure 10 from the manifold 30, or conversely, the manifold 30 is positioned inward of the enclosure 10 from the fan 70 or fan area 72.

Figure 7:
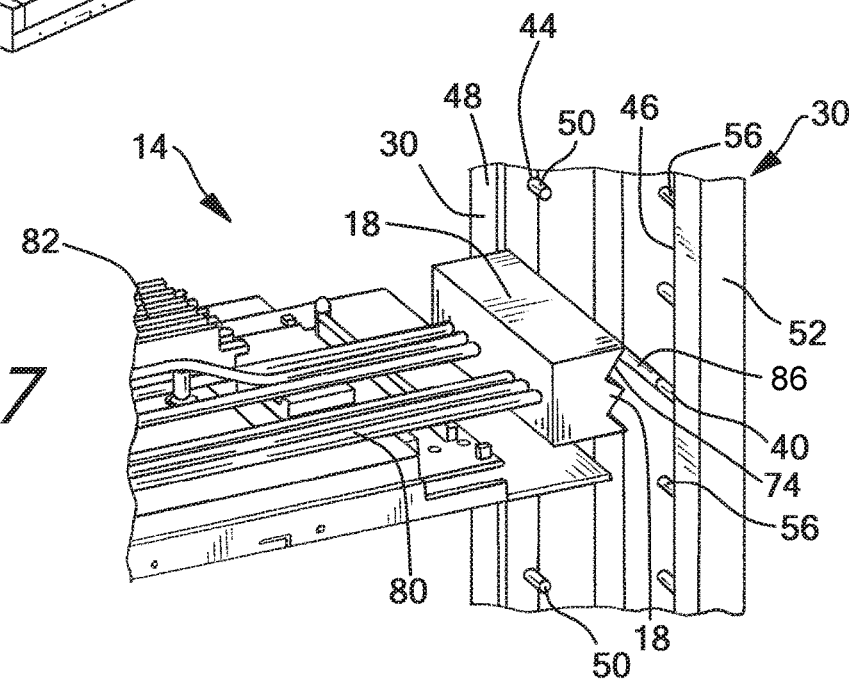
FIG. 7 is an enlarged view of a heat transfer zone of the enclosure.
Figure 8:
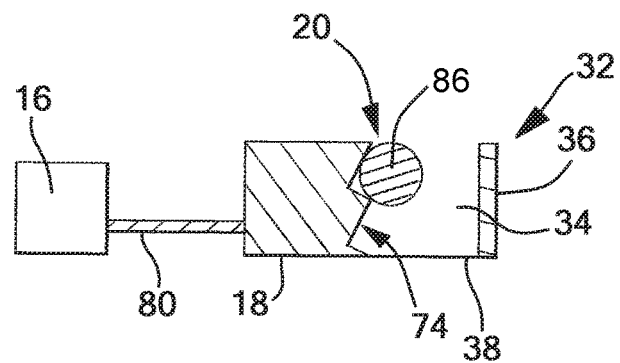
FIG. 8 is an enlarged view in partial cross section taken along line 8-8 of FIG. 4.

Each of the chilled fluid conduits 86 has a generally circular shape in cross-sectional dimension, however, other cross-sectional shapes could be used such as oval or polygonal without departing from the scope of the present invention. Suitable polygonal shapes include polygons having 3 to 12 vertices and include triangles, rectangles, squares, pentagons, etc. As shown in FIG. 7, the heat transfer block 18 has a similar or complementary shaped channel 74, such as wave shaped as shown, or any shape complementary to the shapes of the chilled fluid conduits.

It is contemplated providing valves and pumps to control the flow of chilled liquid from a source of chilled liquid to the chilled surfaces and for controlling the flow of heated liquid away from the chilled surface. For example, valves could be used to individually and independently control the flow of chilled liquid so that only the chilled surfaces corresponding to an extant blade server are provided with cooling liquid. The idle chilled surfaces, those with no corresponding blade server present, are not provided with a chilled liquid. The chilled liquid most preferably is liquid water but could also be other liquids, gases, supercritical fluids, including carbon dioxide (dry ice), and liquid nitrogen, for example.

FIG. 6 shows an example of a blade server 14 having a processor 16. The blade server 14 has a plurality of heat exchange tubes 80. One set of tubes connects the processor 16 with the heat exchange block 18 and another set of tubes 80 connects the heat exchange block 18 with a set of heat fins 82.

While various embodiments of the present invention have been described above, it should be understood that they have been presented by way of example only, and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

The terminology used herein is for the purpose of describing particular embodiments only and is not intended to be limiting of the invention. As used herein, the singular forms "a", "an" and "the" are intended to include the plural forms as well, unless the context clearly indicates otherwise. Furthermore, to the extent that the terms "including", "includes", "having", "has", "with", or variants thereof are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

We claim:

1. A liquid-cooled insert for a blade server enclosure, comprising:
    wherein the blade server enclosure has a slot for receiving a blade server,
    wherein the blade server has a processor that generates heat and a heat transfer block for dissipating heat from the processor,
    wherein, when the blade server is positioned in the blade server enclosure, the heat transfer block is located within a heat transfer zone of the enclosure,
    a manifold mounted to the enclosure for supporting a chilled surface extending into the heat transfer zone, the chilled surface having a fluid conduit running there through having a cold liquid inlet and a hot liquid outlet, the chilled surface is in the heat transfer zone and is in surface contact with the heat transfer block, wherein the manifold has a C-shaped wall defining a vertical channel;
    a first conduit connecting a supply of cold liquid with the cold liquid inlet, wherein the first conduit extends through the vertical channel from one terminal flange to an opposite terminal flange for engaging a heat exchange block; and
    a second conduit connecting the hot liquid outlet to a location away from the heat transfer zone.

2. The liquid-cooled insert of claim 1 further comprising a first plurality of slots spaced from one another along a first direction in the enclosure and the manifold having a second plurality of chilled surfaces spaced along the first direction wherein the second plurality is equal to or greater than the first plurality.

3. The liquid-cooled insert of claim 2 wherein the first conduit and the second conduit extend along the first direction and the second plurality of chilled surfaces extend along a second direction generally perpendicular to the first direction.

4. The liquid-cooled insert of claim 1 wherein the chilled surface has a generally circular shape in cross-sectional dimension and the heat transfer block has a concave channel for contacting the chilled surface.

5. The liquid-cooled insert of claim 1 wherein the manifold has a peripheral wall defining a channel and the first conduit is positioned within the channel.

6. A blade server enclosure comprising:
a slot in the enclosure for receiving a blade server having a processor that generates heat, and a heat transfer block for dissipating heat from the processor in a heat transfer zone of the enclosure;
a manifold mounted to the enclosure for supporting a chilled surface extending into the heat transfer zone, the chilled surface having a fluid conduit running therethrough having a cold liquid inlet and a hot liquid outlet, the chilled surface is in surface contact with the heat transfer block, wherein the manifold has a C-shaped wall defining a vertical channel;
a first conduit connecting a supply of cold liquid with the cold liquid inlet, wherein the first conduit extends through the vertical channel from one terminal flange to an opposite terminal flange for engaging a heat exchange block; and
a second conduit connecting the hot liquid outlet away from the heat transfer zone.

7. The blade server enclosure of claim 6 further comprising an electric fan mounted to the enclosure for dissipating heat from the enclosure.

8. The blade server enclosure of claim 7 wherein the manifold is positioned inward of the enclosure with respect to the fan.

9. The blade server enclosure of claim 6 further comprising a first plurality of slots spaced from another along a first direction in the enclosure and the manifold having a second plurality of chilled surfaces spaced along the first direction wherein the second plurality is equal to or greater than the first plurality.

10. The blade server enclosure of claim 9 wherein the first conduit and the second conduit extend along the first direction and the second plurality of chilled surfaces extend along a second direction generally perpendicular to the first direction.

11. The blade server enclosure of claim 10 wherein the first conduit has a generally circular shape in cross sectional dimension and the heat transfer block has a concave channel for contacting the chilled surface.

12. The blade server enclosure of claim 6 wherein the manifold has a peripheral wall defining a channel and the chilled surface is positioned within the channel.

13. A hybrid cooled blade server enclosure comprising:
a slot in the enclosure for receiving a blade server having a processor that generates heat, and a heat transfer block for dissipating heat from the processor in a heat transfer zone of the enclosure;
a manifold mounted to the enclosure for supporting a chilled surface extending into the heat transfer zone, the chilled surface having a fluid conduit running there through having a cold liquid inlet and a hot liquid outlet, the chilled surface is in surface contact with the heat transfer block, wherein the manifold has a C-shaped wall defining a vertical channel;
a first conduit connecting a supply of cold liquid with the cold liquid inlet, wherein the first conduit extends through the vertical channel from one terminal flange to an opposite terminal flange for engaging a heat exchange block;
a second conduit connecting the hot liquid outlet away from the heat transfer zone; and
an electric fan mounted to the enclosure for removing heat from the enclosure.

14. The hybrid cooled blade server enclosure of claim 13 wherein the electric fan is positioned outward of the enclosure from the manifold.

15. The hybrid cooled blade server enclosure of claim 13 further comprising a first plurality of slots spaced from another along a first direction in the enclosure and the manifold having a second plurality of chilled surfaces spaced along the first distance wherein the second plurality is equal to or greater than the first plurality.

16. The hybrid cooled blade server enclosure of claim 15 wherein the first conduit and the second conduit extend along the first direction and the second plurality of chilled surfaces extend along a second direction generally perpendicular to the first direction.

17. The hybrid cooled blade server enclosure of claim 13 wherein the first conduit has a generally circular shape in cross sectional dimension and the heat transfer block has a concave channel for contacting the chilled surface.

18. The hybrid cooled blade server enclosure of claim 13 wherein the manifold has a peripheral wall defining a channel and the chilled surface is positioned within the channel.

19. The hybrid cooled blade server enclosure of claim 18 wherein the peripheral wall is generally C-shaped.

20. The hybrid blade server enclosure of claim 19 wherein the cold liquid inlet extends through a hole in the peripheral wall.

* * * * *